(12) United States Patent
Lee

(10) Patent No.: US 6,737,316 B2
(45) Date of Patent: May 18, 2004

(54) METHOD OF FORMING A DEEP TRENCH DRAM CELL

(75) Inventor: Brian Lee, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 09/999,622

(22) Filed: Oct. 30, 2001

(65) Prior Publication Data

US 2003/0082875 A1 May 1, 2003

(51) Int. Cl.$^7$ .......................................... H01L 21/8242

(52) U.S. Cl. .................. 438/244; 438/243; 438/386; 438/387

(58) Field of Search ................... 438/243–249, 438/386–392

(56) References Cited

U.S. PATENT DOCUMENTS

| | | | | |
|---|---|---|---|---|
| 5,571,730 A | | 11/1996 | Park et al. | 437/21 |
| 5,594,270 A | * | 1/1997 | Hiramoto et al. | 257/393 |
| 5,610,411 A | * | 3/1997 | Takasu | 257/353 |
| 5,641,694 A | * | 6/1997 | Kenney | 438/156 |
| 6,383,864 B2 | * | 5/2002 | Scheller et al. | 438/243 |

* cited by examiner

Primary Examiner—John F. Niebling
Assistant Examiner—Jennifer M Kennedy
(74) Attorney, Agent, or Firm—Birch, Stewart, Kolasch & Birch, LLP

(57) ABSTRACT

A method of forming a deep trench DRAM cell on a semiconductor substrate has steps of: forming a deep trench capacitor in the semiconductor substrate; using silicon-on-insulator (SOI) technology to form a silicon layer on the deep trench capacitor; and forming a vertical transistor on the silicon layer over the deep trench capacitor, wherein the vertical transistor is electrically connected to the deep trench capacitor.

28 Claims, 14 Drawing Sheets

METHOD OF FORMING A DEEP TRENCH DRAM CELL

BACKGROUND OF THE INVENTION

1. Field of the Invention

The present invention relates to a deep trench DRAM process and, more particularly, to a method of forming a deep trench DRAM device to achieve the desired characteristics of low capacitance, smaller cell size, high functionality and simplified manufacturing process.

2. Description of the Related Art

DRAM devices are widely applied in integrated circuits technology, in which a DRAM cell typically consists of a storage capacitor and an access transistor. There is much interest in reducing the size of DRAM devices to increase their density on an IC chip, thereby reducing size and power consumption of the chip, and allowing faster operation. In order to achieve a memory cell with a minimum size, the gate length in a conventional transistor must be reduced to decrease the lateral dimension of the memory cell. This also causes reduction in capacitor area, resulting in the reduction of cell capacitance. Accordingly, an important challenge is to promote storage ability and operating stability of capacitors with decreased scale and increased integration of the DRAM device. A vertical transistor has recently been developed which can maintain the gate length at a suitable value for obtaining low leakage, without decreasing the bit line voltage or increasing the memory cell's lateral dimension. Also, a deep trench capacitor can be fabricated directly below the vertical transistor without consuming any additional wafer area.

U.S. Pat. No. 5,571,730 discloses a deep trench DRAM device with a vertical transistor and a method for manufacturing the same. FIG. 1 is a top view showing the DRAM cell, wherein reference symbol WL indicates a wordline, T indicates a transistor, BC indicates a bitline contact hole, $BL_1$ indicates a first bitline, and $BL_2$ indicates a second bitline. The transistor T is formed in a shape extended in the wordline direction, and the bitline contact hole BC is located to one side of the center of the transistor T in the wordline direction. Multi-layered bitlines are formed, so that adjacent transistors T in the wordline direction are connected with the first bitline $BL_1$ and the second bitline $BL_2$, respectively, both of which are located at different heights.

FIGS. 2A to 2E are cross-sections along line 2—2 in FIG. 1 showing the conventional method of forming the DRAM cell. As shown in FIG. 2A, a first semiconductor substrate 10 is etched to form silicon pillars 12, and a source region 14 is formed on the top of the pillar 12. An oxide film 15 is then deposited on the entire surface of the first semiconductor substrate 10 to form a groove in the space in the wordline direction. Next, a nitride film 16 is conformally deposited on the oxide film 15, and an oxide layer 17 is deposited to completely fill the grooves between pillars 12. Thereafter, a plurality of first contact holes 18 is formed to expose the source regions 14, respectively.

As shown in FIG. 2B, a conductive material is deposited and patterned to form a capacitor storage electrode 19 connected to the source region 14 through the first contact hole 18. Thereafter, a dielectric film 20 is deposited on the entire surface of the capacitor storage electrode 19, and then a plate electrode 21 is deposited on the entire surface of the dielectric film 20 to fill the under-cut portion of the storage capacitor electrode 19. Thus, a first capacitor C1 and a second capacitor C2 are completed. As shown in FIG. 2C, a first insulating layer 22 is deposited on the plate electrode 21, and a new wafer is attached on the first insulating layer 22 by a direct wafer bonding method, thus providing a second semiconductor substrate 24. Next, after turning the backside of the first semiconductor substrate 10 upward, the backside of first semiconductor substrate 10 is etched until the oxide film 15 is exposed.

As shown in FIG. 2D, a drain region 25 is formed on the upper portion of the pillar 12, and the oxide film 15 is isotropically etched with the nitride film 16 as the etch-blocking layer. Next, a gate insulating film 26 is formed by thermally oxidizing the exposed surface of the pillars 12. Thereafter, a conductive layer 27 is deposited on the entire surface of the resultant structure. As shown in FIG. 2E, the conductive layer 27 is etched to form a gate electrode 28 surrounding the pillar 12. Thus, the transistors T1, T2 comprised of the source region 14, the drain region 25 and the gate electrode 28 are completed. Next, after depositing a second insulating layer 29 on the entire surface of the second semiconductor substrate 24, a first bitline contact hole 30 is formed to expose the drain region 25 of the first transistor T1. Thereafter, a conductive layer filling the first bitline contact hole 30 is patterned to serve as a first bit line $BL_1$. Next, a third insulating layer 31 is deposited on the entire surface of the second semiconductor substrate 24, and then a second bitline contact hole 32 is formed to expose the drain region 25 of the second transistor T2. Finally, a conductive layer filling the second bitline contact hole 32 is patterned to serve as a second bit line $BL_2$.

However, in the above-described method for manufacturing the DRAM cell, the structures of the deep trench capacitor, the collar structure and the source region 14 are formed on the front side of first substrate 10, and then reversed to attach the second substrate 24. The other structures of gate electrode 28, drain region 25, and vertical channel are formed on the back side of the first substrate 10. This complicated process increases process time and production cost. Thus, a simple deep trench DRAM process solving the aforementioned problems is called for.

SUMMARY OF THE INVENTION

The present invention provides a method of forming a deep trench DRAM cell, preferably a sub-150 nm DRAM device, to achieve the desired characteristics of low capacitance, smaller cell size, high functionality and simple collar process.

A method of forming a deep trench DRAM cell is performed on a semiconductor substrate, which has a collar oxide plate and a plurality of deep trenches passing through the collar oxide plate and the substrate to a predetermined depth. First, a deep trench capacitor is formed in each deep trench, wherein the deep trench capacitor has an ion diffusion region with a second conductive type in the substrate surrounding the deep trench, a dielectric layer on the sidewall and bottom of the deep trench, and a first doped polysilicon layer filling the deep trench. Then, using SOI technology, a silicon layer is formed on the planarized surface of the collar oxide plate and the first doped polysilicon layer. Next, a first ion-diffusion layer is formed on the top of the silicon layer. Next, the ion-diffusion layer and the silicon layer on the collar oxide plate are removed to form a plurality of pillars. Then, an oxide layer is formed on the entire surface of the first doped polysilicon layer. Thereafter, a second ion-diffusion layer is formed on the sidewall of the silicon layer, and then annealing treatment is used to form a third ion-diffusion layer at the bottom of the silicon layer.

Next, a nitride liner is formed on the entire surface of the substrate, and a second doped polysilicon layer with the second conductive type is formed on the nitride liner, wherein the top of the second doped polysilicon layer reaches the top of the third ion diffusion region. After oxidizing the second doped polysilicon layer to form an oxidation layer, the exposed region of the nitride liner is removed. Finally, a third doped polysilicon layer is formed on the oxidization layer surrounding each of the pillars.

Accordingly, it is a principal object of the invention to provide a simple process to manufacture a deep trench DRAM cell with a vertical transistor.

It is another object of the invention to provide the collar oxide plate prior to the formation of the deep trench.

Yet another object of the invention is to omit the buried strap (BS) process.

It is a further object of the invention to decrease process time and production cost.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
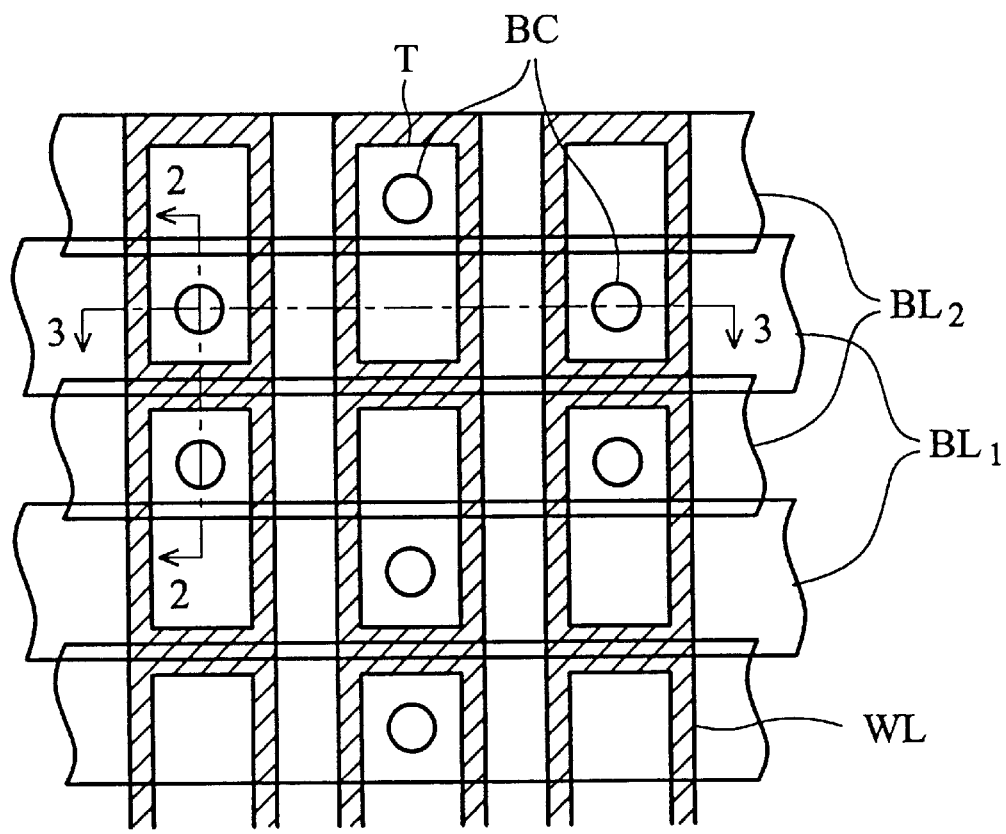
FIG. 1 is a top view showing a DRAM cell.
Figure 2A:
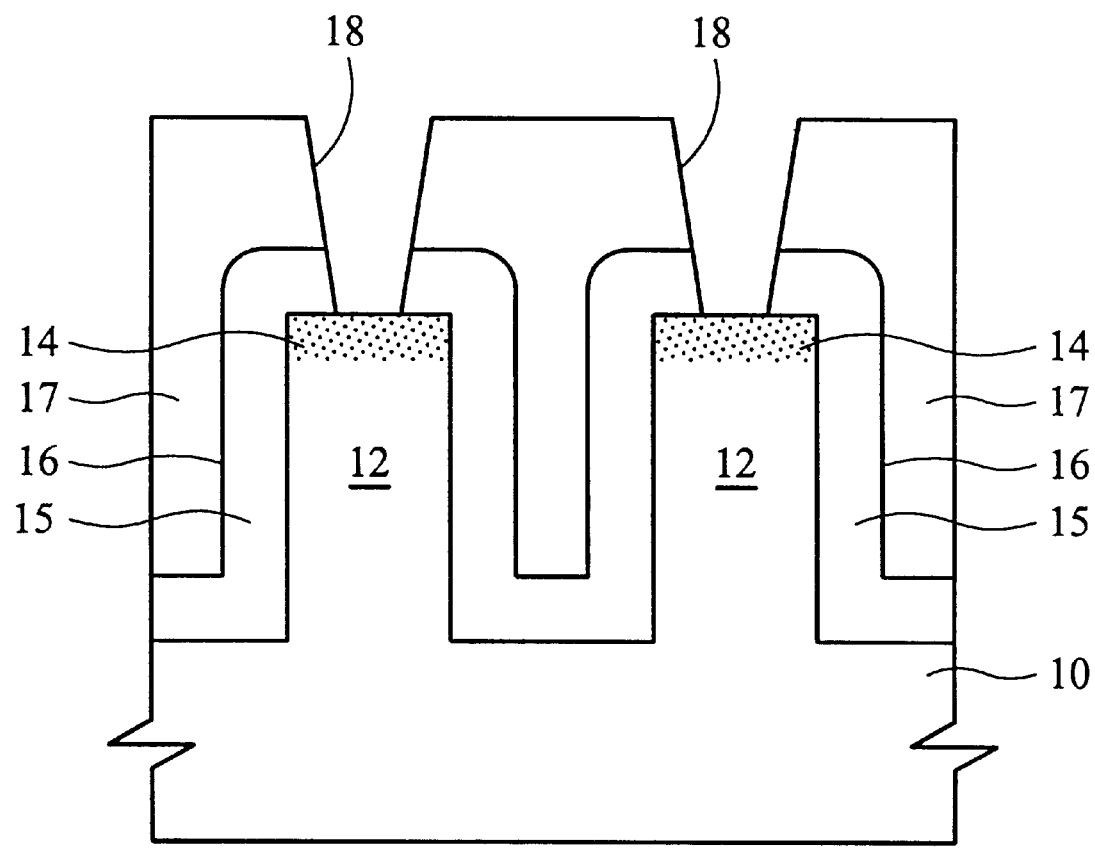
FIGS. 2A to 2E are cross-sectional views along line 2—2 in FIG. 1 showing the conventional method of forming the DRAM cell.
Figure 2B:
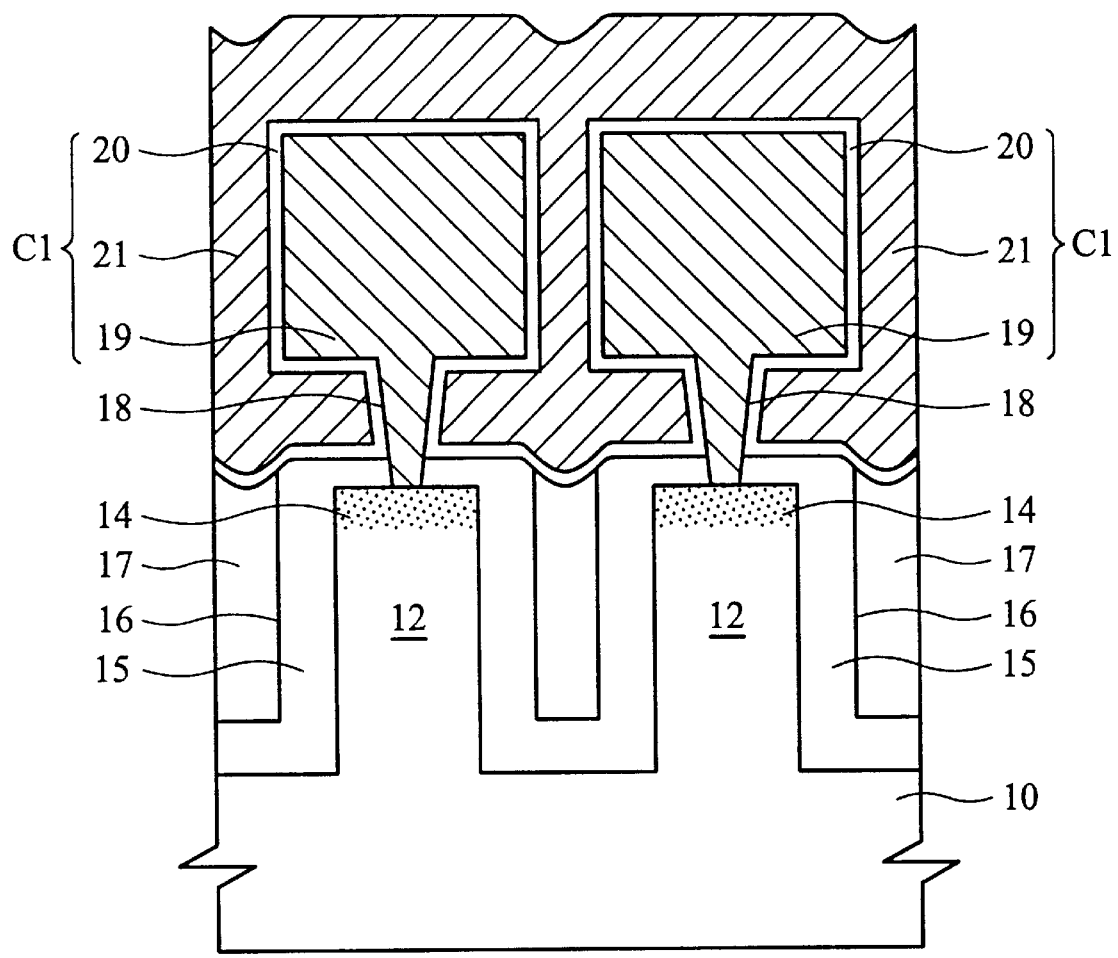
Figure 2C:
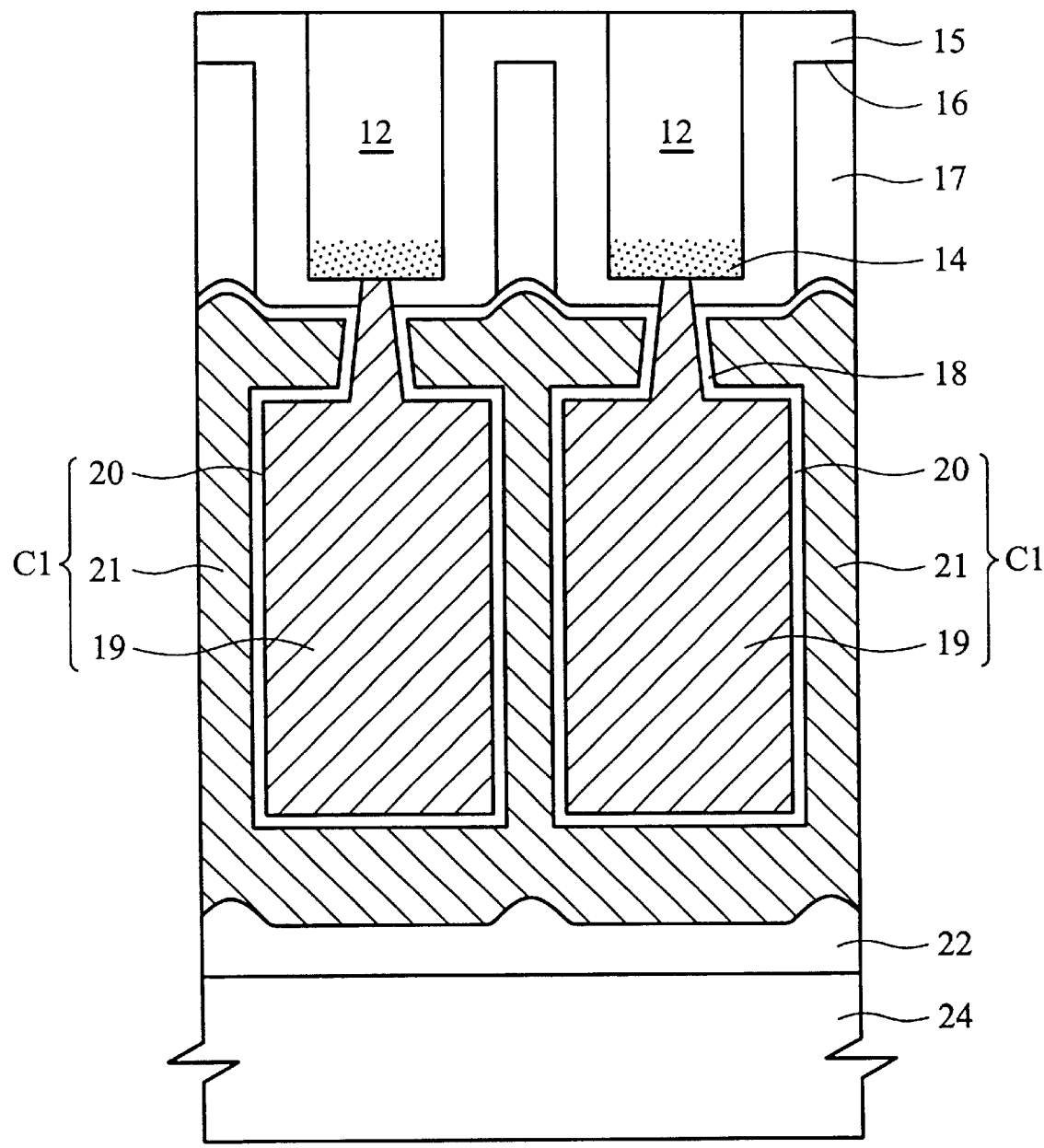
Figure 2D:
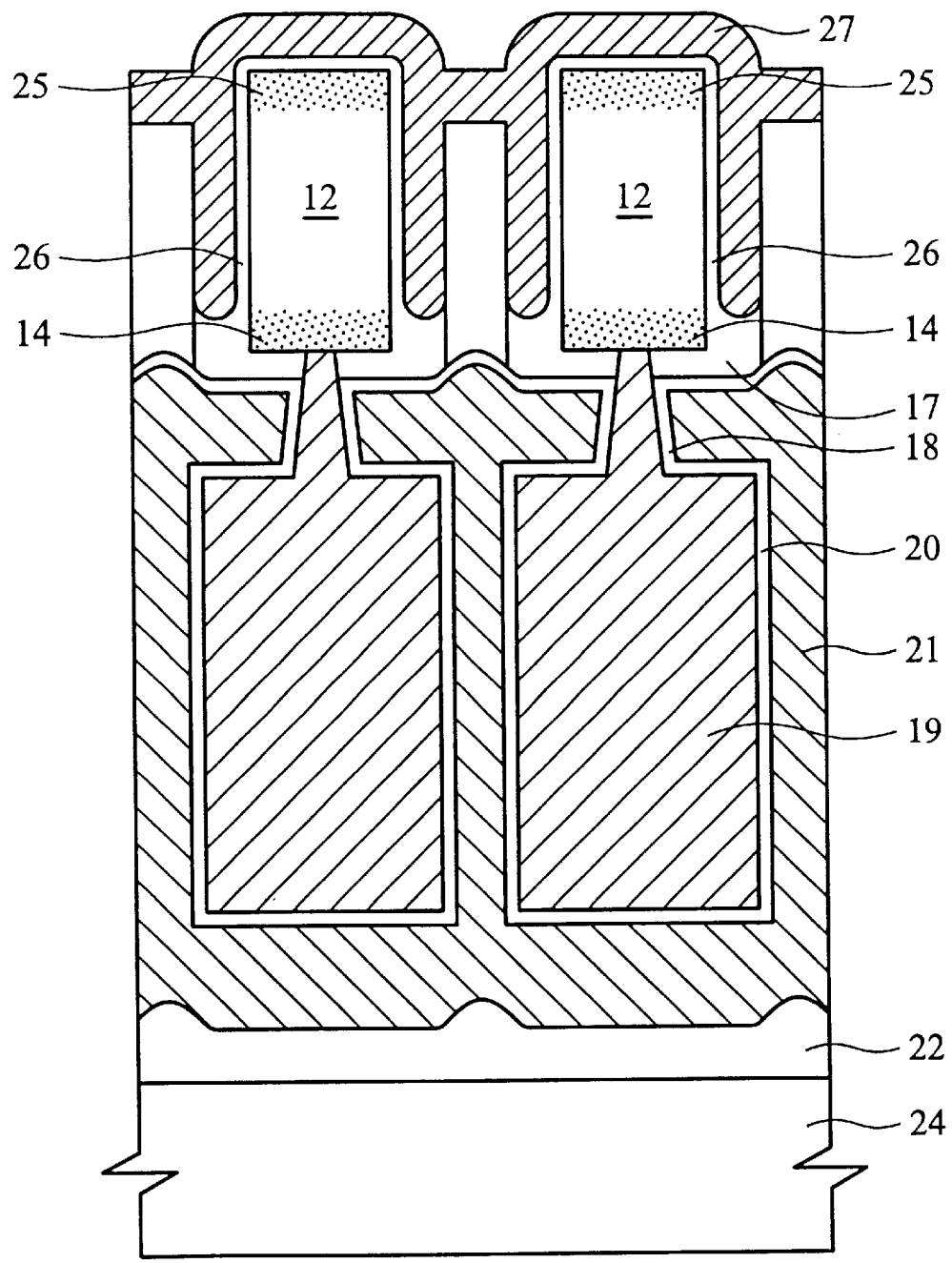
Figure 2E:
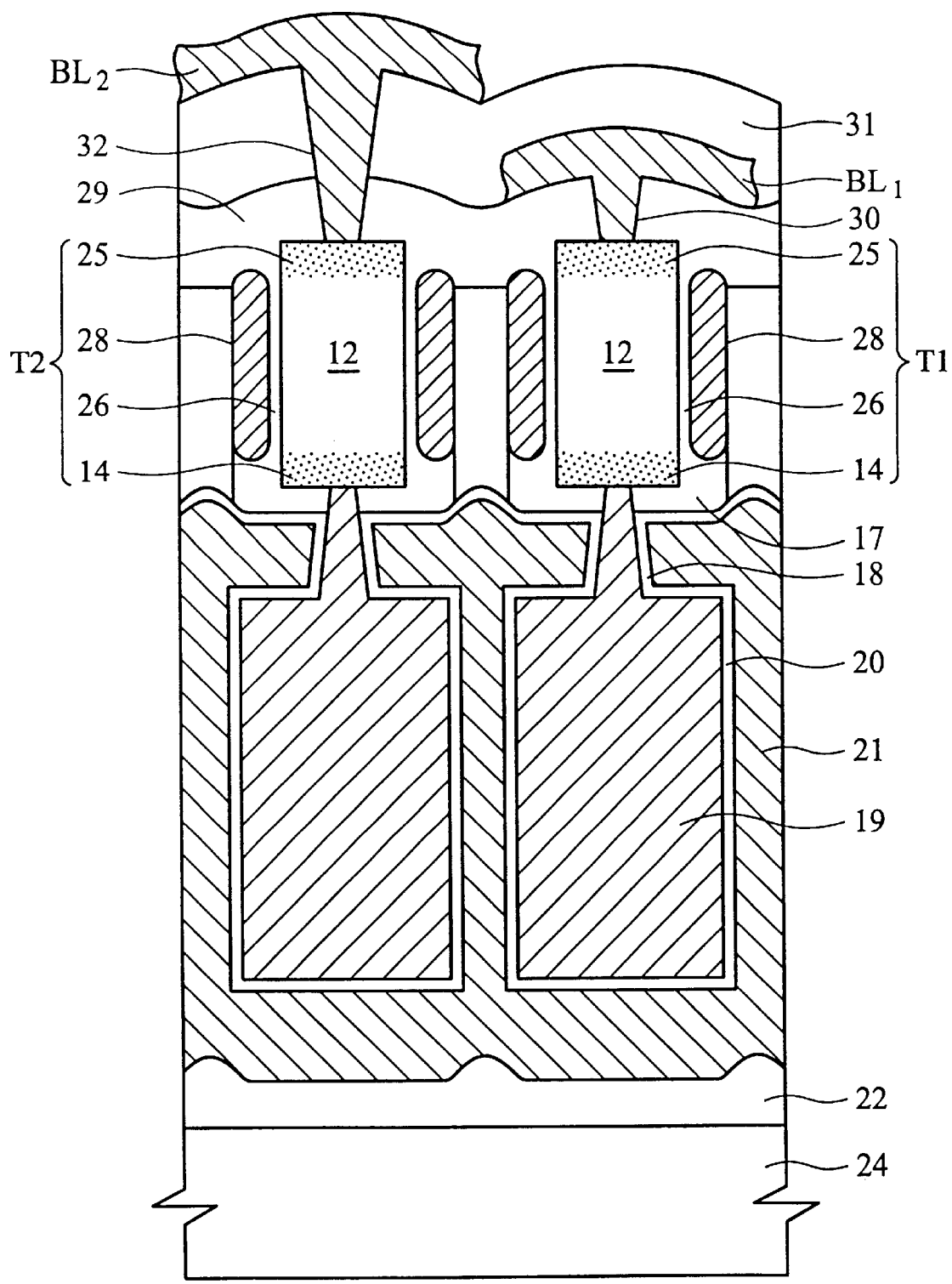
Figure 3A:
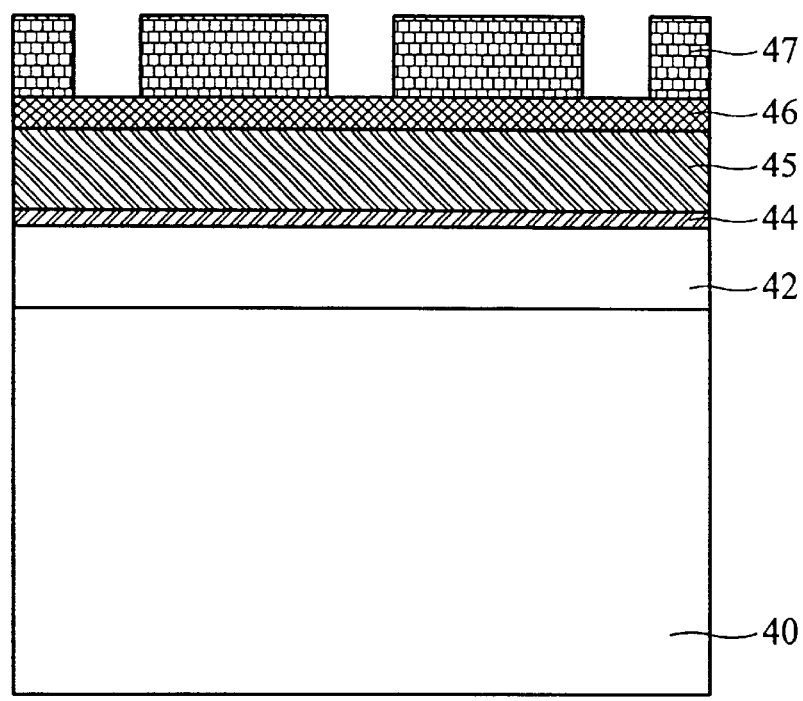
FIGS. 3A to 3J are cross-sectional diagrams along line 2—2 in FIG. 1 showing a method of forming a deep trench DRAM cell according to the present invention.
Figure 3B:
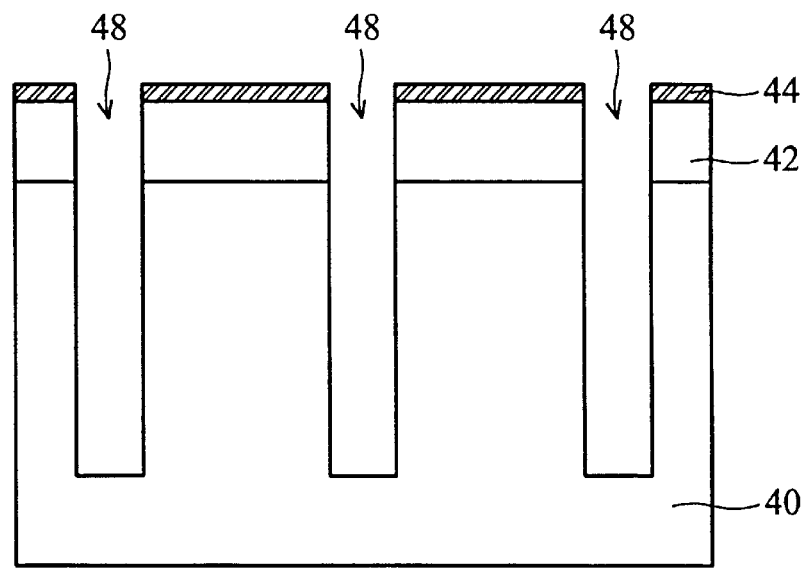

The present invention provides a method of forming a deep trench DRAM cell, preferably a sub-150 nm DRAM device, to achieve the desired characteristics of low capacitance, smaller cell size, high functionality and simple collar process. FIGS. 3A to 3J are cross-sectional diagrams along line 3—3 in FIG. 1 showing a method of forming a deep trench DRAM cell according to the present invention. As shown in FIG. 3A, a semiconductor silicon substrate 40 for example, a p$^+$-doped silicon substrate, is provided with a surface successively covered by a collar oxide plate 42 of 200~300 nm, a SiN stopping layer 44 of 20~50 nm, a BSG hard mask 45 of more than 1200 nm, a polysilicon mask layer 46, and a patterned photoresist layer 47. In another embodiment, a TERA hard mask may replace the polysilicon mask layer 46. Then, using dry etching with the patterned photoresist layer 47 as the mask, exposed regions of the polysilicon mask layer 46 are removed and the photoresist layer 47 is stripped. Next, using dry etching again with the remaining polysilicon mask layer 46 as a mask, the BSG hard mask 45, the SiN stopping layer 44, the collar oxide plate 42 and the substrate 40 are successively removed. Thus, as shown in FIG. 3B, a plurality of deep trenches 48 is formed in the substrate 40 to reach a predetermined depth of less than 5 m. Thereafter, wet etching cleans the deep trenches 48 and a stripping process follows to remove the BSG hard mask 45. In another embodiment, wet etching is further used to form the deep trench 48 as a bottle-shaped trench to increase the capacitance of the deep trench capacitor.

Figure 3C:
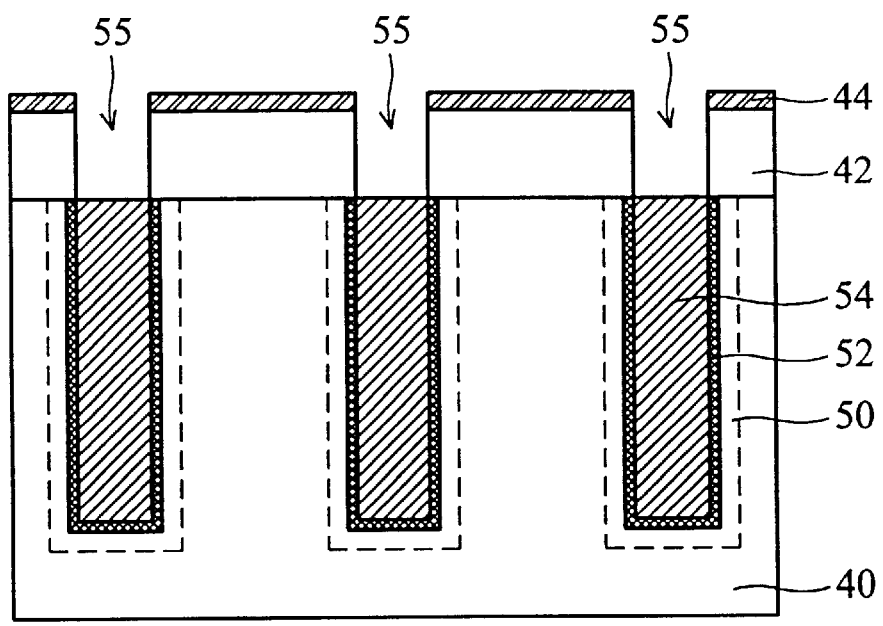

As shown in FIG. 3C, using GPD/ASG deposition with annealing treatment, an n$^+$ diffusion region 50 is formed in the substrate 40 surrounding the deep trench 48. Then, an NO dielectric 52 comprising a silicon nitride layer and an oxide layer is formed on the sidewall and bottom of the deep trench 48. Next, a first n$^+$-doped polysilicon layer 54 is deposited to fill the deep trenches 48, and then the top of the first polysilicon layer 54 surrounded by the collar oxide plate 42 and the SiN stopping layer 44 is recessed to form a plurality of openings 55. Thereafter, wet etching is used to clean the openings 55. This completes a deep trench capacitor consisting of the n$^+$ diffusion region 50, the NO dielectric 52 and first n$^+$-doped polysilicon layer 54 in each deep trench 48.

Figure 3D:
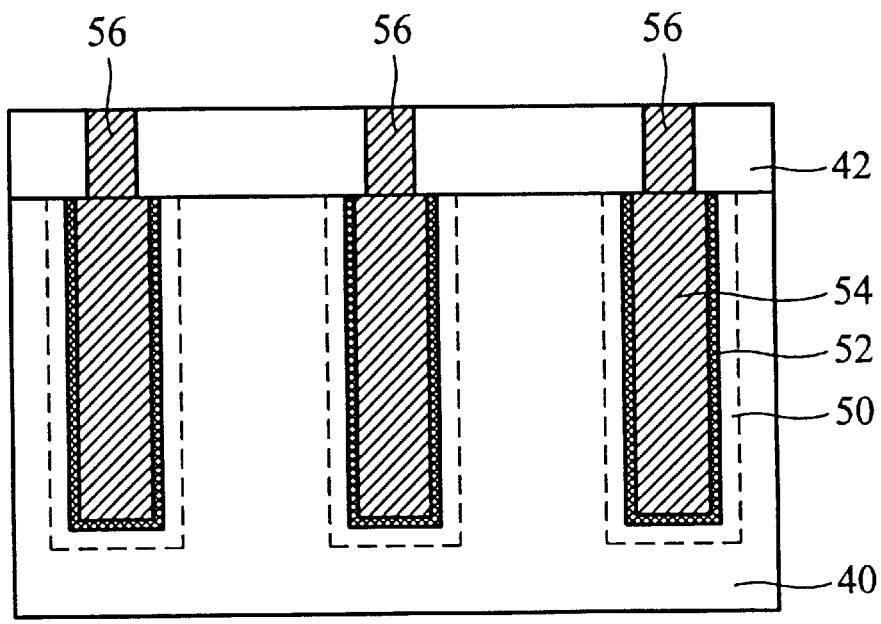

As shown in FIG. 3D, a second n$^+$-doped polysilicon layer 56 is deposited to fill the openings 55 and then annealing treatment is performed on it. Next, chemical mechanical polishing (CMP) is used to level off the surfaces of the second polysilicon layer 56 and the SiN stopping layer 44. Next, after removing the SiN stopping layer 44, CMP is used again to planarize the surfaces of the second polysilicon layer 56 and the collar oxide plate 42. Thus, the second polysilicon layer 56 surrounded by the collar oxide plate 42 serves as a connection between the deep trench capacitor and the vertical transistor manufactured in subsequent processes. Thereafter, wet etching is used to clean the entire surface of the substrate 40.

Figure 3E:
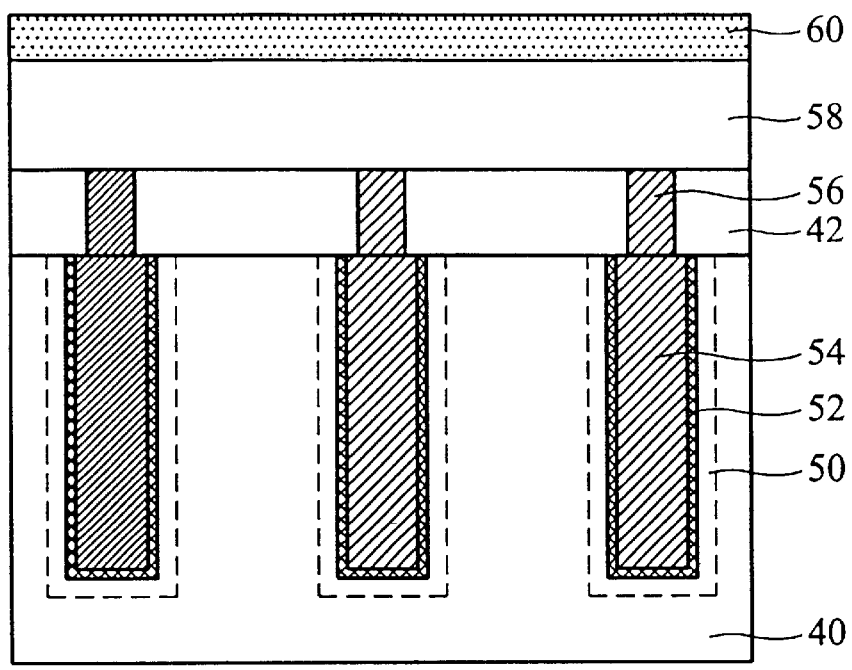
Figure 4A:
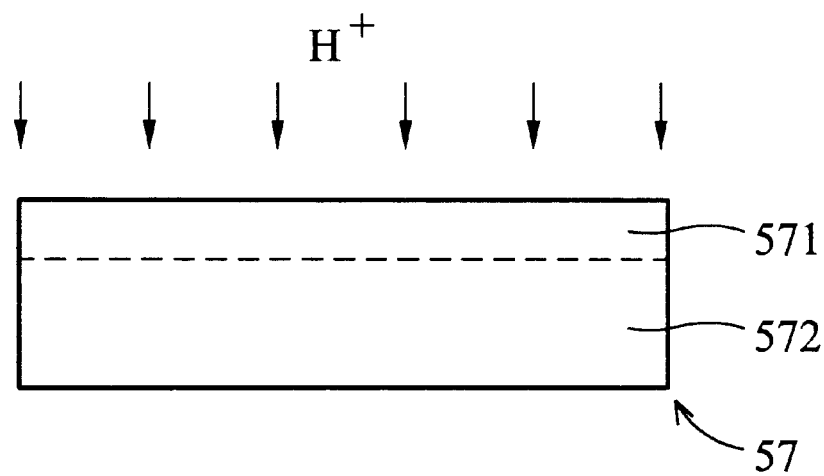
FIGS. 4A to 4D show illustrations of the silicon-on-insulator (SOI) technology used in FIG. 3E.
Figure 4B:
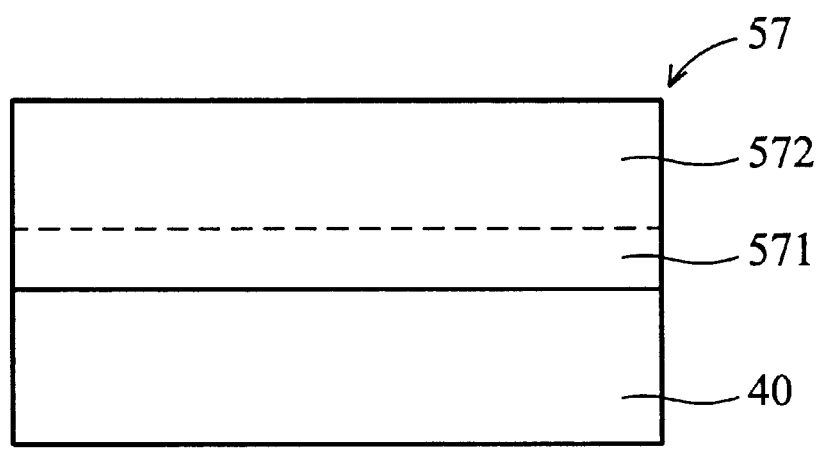
Figure 4C:
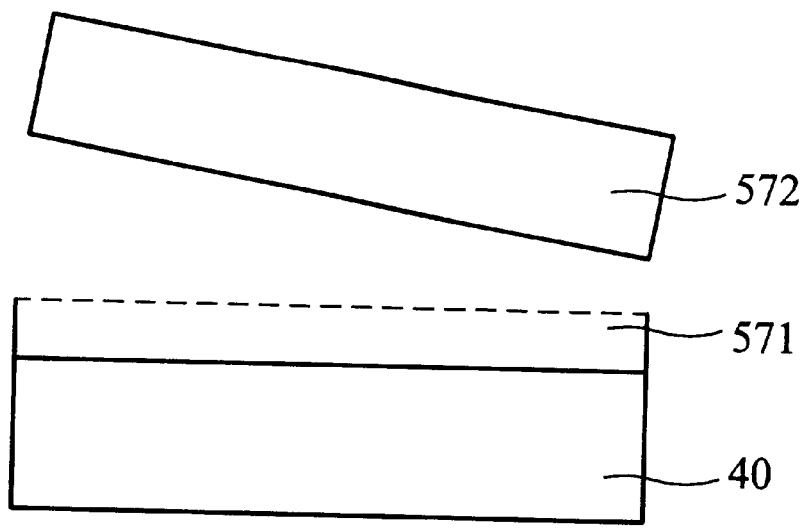
Figure 4D:
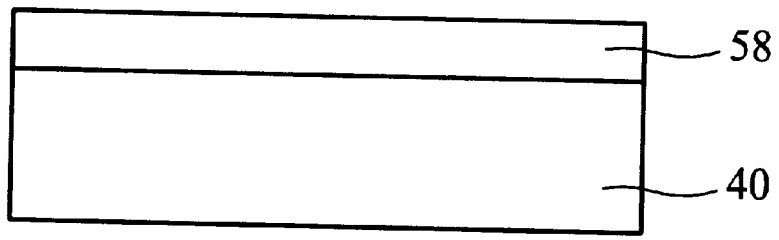

As shown in FIG. 3E, using silicon-on-insulator (SOI) technology, a silicon layer 58 of more than 500 nm is formed on the planarized surface of the substrate 40. Then, using ion implantation, an n$^+$-doped layer 60 is formed on top of the silicon layer 58. In another embodiment, annealing may be further used. Please refer to FIGS. 4A to 4D which show the SOI process. First, as shown in FIG. 4A, a thick silicon wafer 57 is provided with an oxygen treatment to form a silicon oxide layer, and then hydrogen ion implantation is employed to form a predetermined cutting line between an ion-implanted region 571 and a non-implanted region 572 in the thick silicon wafer 57. Next, as shown in FIG. 4B, using wafer-bonding technology, the thick silicon wafer 57 is reversed and bonded to the planarized surface of the substrate 40. Then, as shown in FIG. 4C, using annealing at a temperature less than 600° C., the non-implanted region 572 on the backside of the silicon wafer 57 serving as a sacrificial layer is cleaved off. Finally, as shown in FIG. 4D, using annealing at a temperature approximately 1100° C. and using CMP to planarize the ion-implanted region 571, the remaining part of the ion-implanted region 571 formed on the planarized surface of the substrate 40 serves as the silicon layer 58.

Figure 3F:
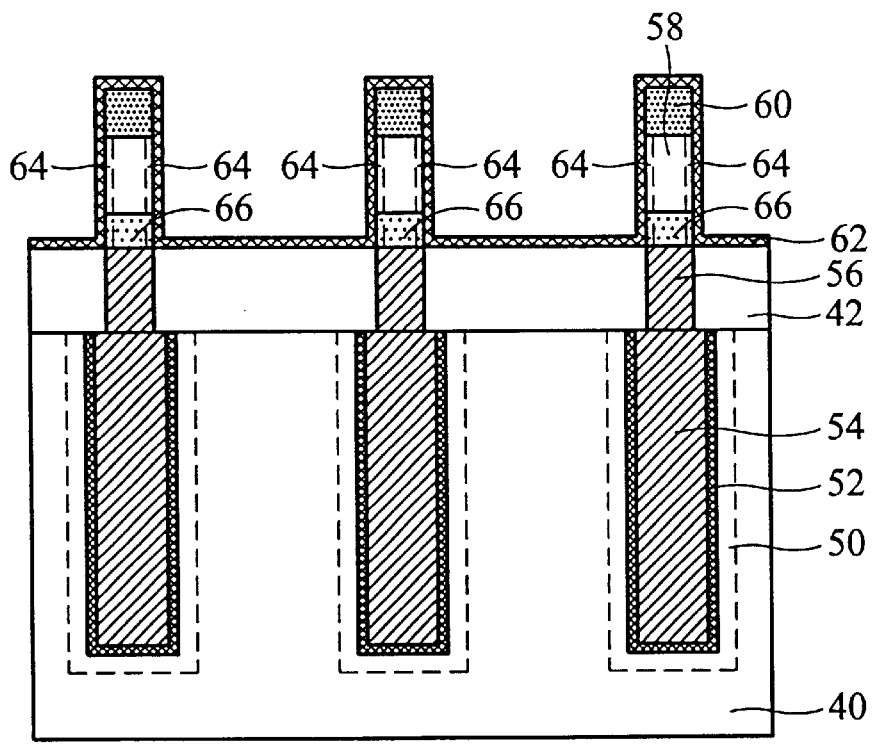

As shown in FIG. 3F, using dry etching with a hard mask on the n$^+$-doped layer 60, part of the n$^+$-doped layer 60 and the silicon layer 58 are removed, resulting in a plurality of pillars on the second polysilicon layer 56. Then, after wet cleaning, an oxide layer 62 is formed on the entire surface of the substrate 40 by thermal oxidation. Thereafter, for tuning the threshold voltage ($V_t$) of the vertical transistor, angled implantation is used to form a p-doped region 64 on the sidewall of the silicon layer 58. Then, using RTP annealing treatment, the ions in the second polysilicon layer 56 diffuse into the bottom of the silicon layer 58 to provide a drain region 66. Then, wet etching is used to clean the surface.

Figure 3G:
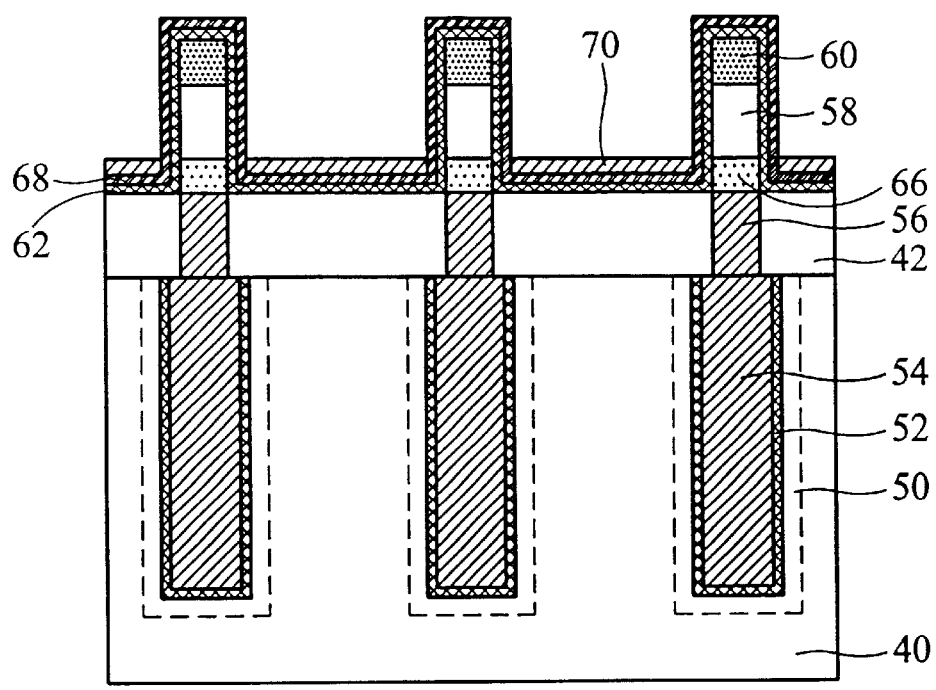
Figure 3H:
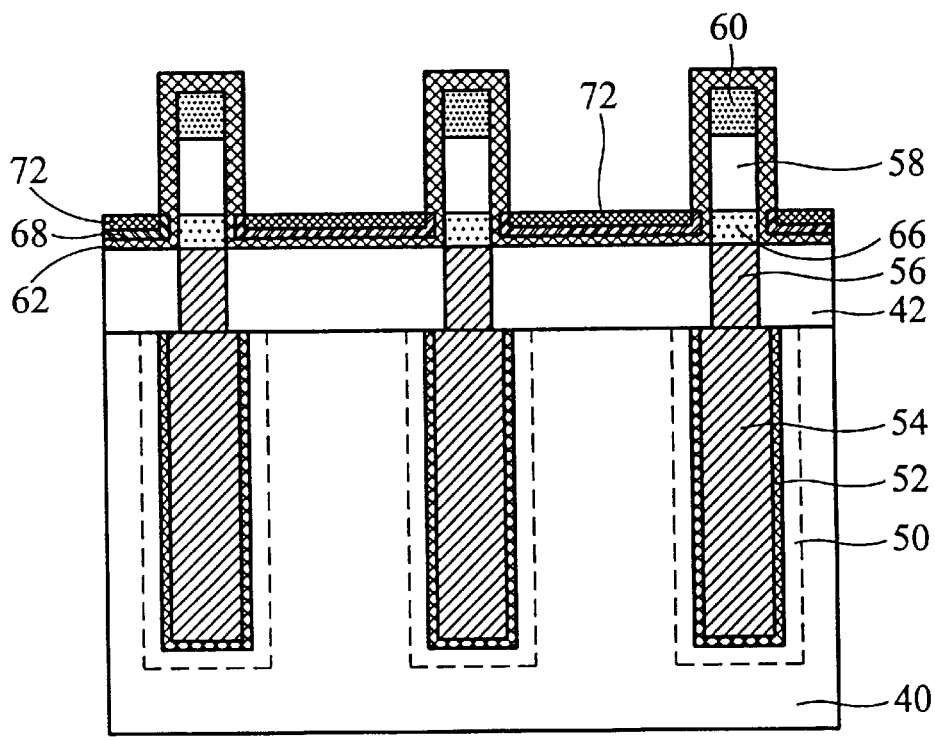

As shown in FIG. 3G, a SiN liner 68 is conformally deposited on the entire surface of the oxide layer 62, and a third doped polysilicon layer 70 is conformally deposited on the SiN liner 68. Next, the third doped polysilicon layer 70 is recessed until the top of the third doped polysilicon layer 70 reaches the top of the drain region 66. As shown in FIG. 3H, using thermal oxidization to oxidize the third polysilicon layer 70, the oxide layer and the oxidized polysilicon layer 70 become an oxidation layer 72. Meanwhile, part of the SiN liner 68 is oxidized. Then, the exposed region of the SiN liner 68 is removed and wet etching follows.

Figure 3I:
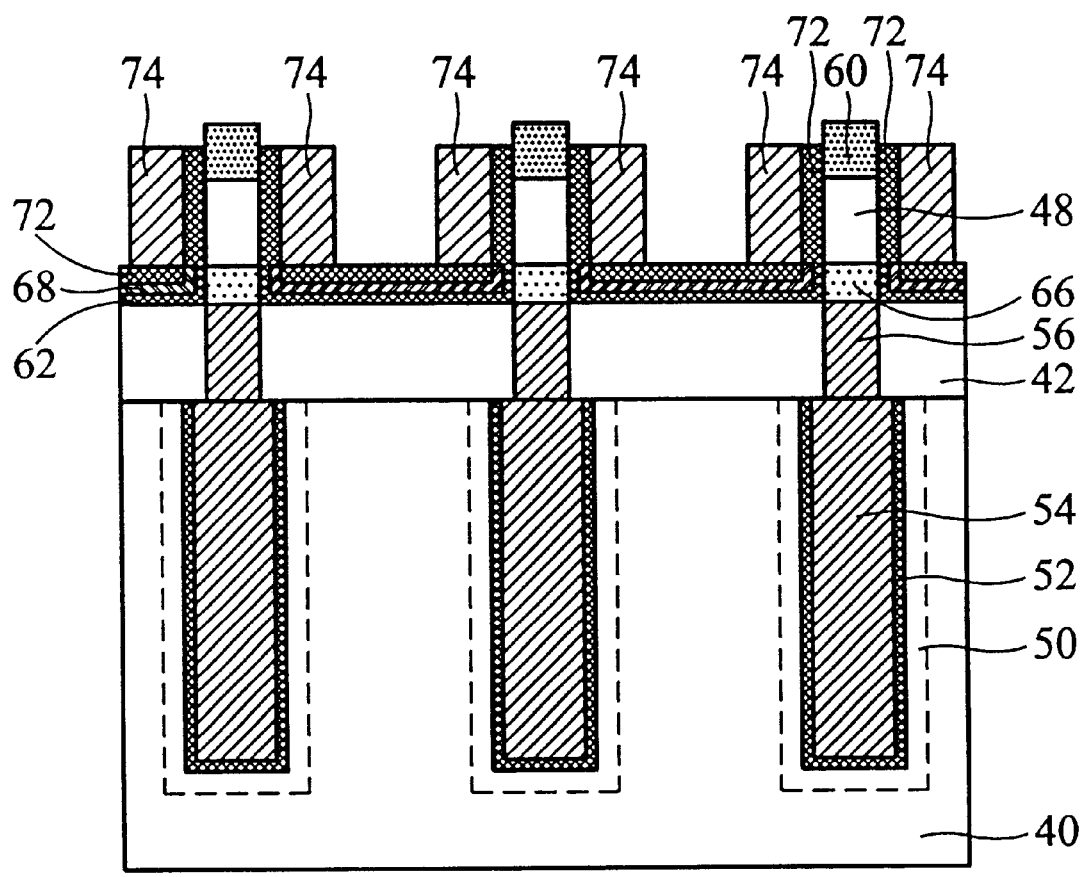
Figure 3J:
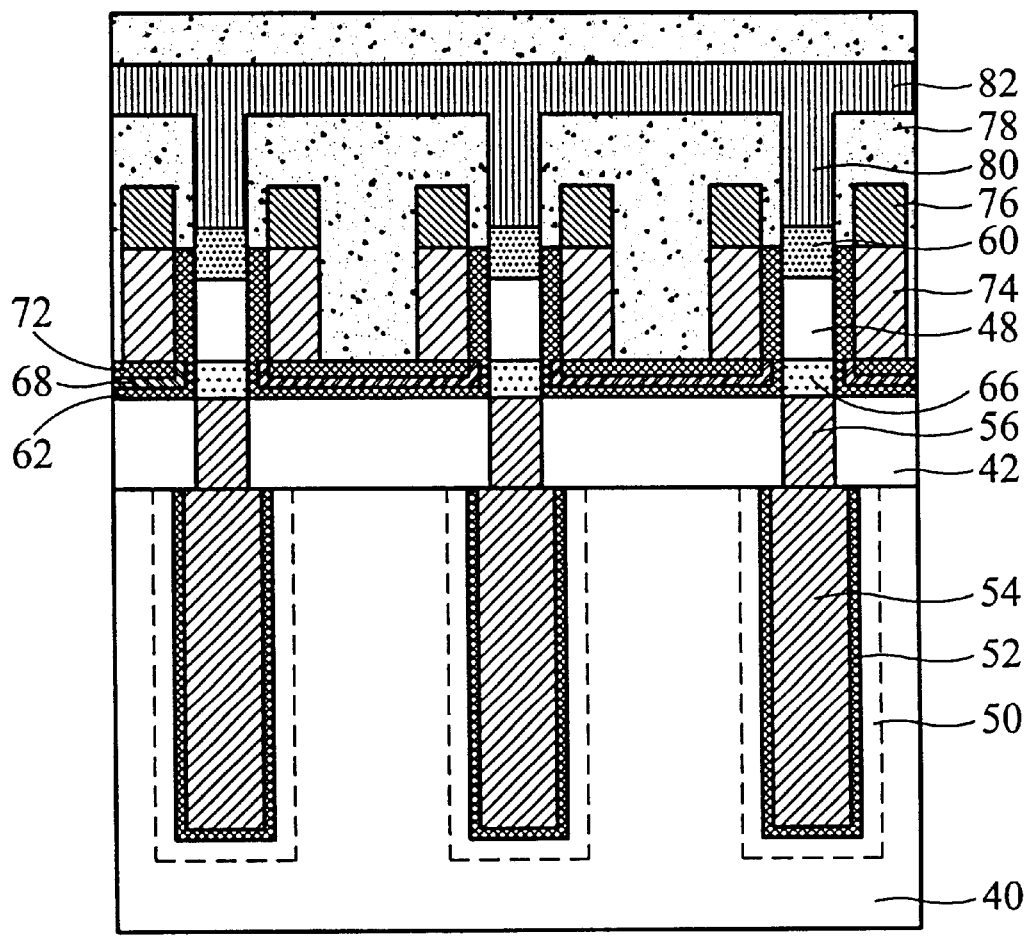

As shown in FIG. 3I, a fourth polysilicon layer 74 is deposited on the oxidization layer 72 and then patterned to surround the pillars. Next, using CMP to recess the top of the fourth polysilicon layer 74 and the oxidization layer 72. Wet cleaning is followed used. Thus, the fourth polysilicon layer 74 surrounding the pillar serves as a gate electrode layer 74, and the oxidization layer 72 on the sidewall of the pillar serves as a vertical channel between the drain region 66 and the source region 60. This completes the vertical transistor over the deep trench capacitor. Finally, as shown in FIG. 3J, word lines 76 are patterned on the gate electrodes 74, and a bitline contact plug 80 passing trough an inter-metal dielectric 78 is connected to a bit line 82.

According to the present invention, the collar oxide plate 42 is formed on the substrate 40 prior to the formation of deep trenches 48, therefore the process is simplified compared with the conventional method that uses the collar process after the formation of the deep trench capacitor. Second, the second polysilicon layer 56, serving as a connection to device, is formed in the opening 55 patterned during the formation of the deep trench 48. Third, no buried strap (BS) process is necessary. This further simplifies the DRAM cell process to decrease process costs. Fourth, using SOI technology, the silicon layer 58 provides a long channel device, thus the vertical transistor offers sufficient gate length to ensure low leakage, without decreasing the bit line voltage or increasing the memory cell wafer area. Fifth, the deep trench capacitor established below the vertical transistor does not impose a density limitation, because it does not occupy wafer area beyond that of the vertical transistor.

It is to be understood that the present invention is not limited to the embodiments described above, but encompasses any and all embodiments within the scope of the following claims.

What is claimed is:

1. A method of forming a deep trench DRAM cell on a semiconductor substrate of a first conductive type, comprising the steps of:
    forming a deep trench capacitor in the semiconductor substrate;
    providing a silicon wafer;
    using an oxygen treatment to form a silicon oxide layer on the silicon wafer;
    using hydrogen ion implantation to form a predetermined cutting line between an ion-implanted region and a non-implanted region in the silicon wafer;
    using wafer-bonding technology to reverse and bond the silicon wafer to the silicon substrate;
    cleaving off the non-implanted region on the backside of the silicon wafer;
    using CMP to planarize the ion-implanted region, whereby the remaining part of the ion-implanted region formed on the semiconductor substrate serves as a silicon layer on the deep trench capacitor; and
    forming a vertical transistor in the silicon layer over the deep trench capacitor, wherein the vertical transistor is electrically connected to the deep trench capacitor.

2. The method according to claim 1, wherein the method of forming the deep trench capacitor comprises steps of:
    forming a deep trench in the semiconductor substrate;
    forming an ion diffusion region with a second conductive type in the semiconductor substrate surrounding the deep trench;
    forming a dielectric layer on the sidewall and bottom of the deep trench; and
    forming a first doped polysilicon layer with the second conductive type to fill the deep trench.

3. The method according to claim 1, wherein the step of cleaving off the non-implanted region uses annealing at a temperature less than 600° C.

4. The method according to claim 1, wherein before the step of using CMP, the ion-implanted region is annealed at 1100° C.

5. The method according to claim 1, wherein the method of forming the vertical transistor comprises steps of:
    forming a first ion-diffusion layer with the second conductive type on the top of the silicon layer;
    patterning the first ion-diffusion layer and the silicon layer to form a pillar over the deep trench capacitor;
    forming an oxide layer on the entire surface of the semiconductor substrate;
    forming a second ion-diffusion layer with the first conductive type on the sidewall of the silicon layer;
    forming a third ion-diffusion layer with the second conductive type at the bottom of the silicon layer;
    forming a nitride liner on the entire surface of the semiconductor substrate;
    forming a second doped polysilicon layer with the second conductive type on the nitride liner, wherein the top of the second doped polysilicon layer reaches the top of the third ion diffusion region;
    oxidizing the second doped polysilicon layer to form an oxidation layer; and
    removing the exposed region of the nitride liner; and
    forming a third doped polysilicon layer with the second conductive type on the oxidization layer and surrounding the pillar.

6. The method according to claim 5, wherein the second ion-diffusion region is formed by angled implantation.

7. The method according to claim 5, wherein the third ion-diffusion region is formed by annealing treatment.

8. The method according to claim 5, wherein the method of forming the second doped polysilicon layer comprises steps of:
    depositing the second doped polysilicon layer on the entire surface of the nitride liner;
    using CMP to planarize the second doped polysilicon layer; and
    dry etching to recess the second doped polysilicon layer to reach the top of the third ion-diffusion region.

9. The method according to claim 5, wherein the method of forming the third doped polysilicon layer comprises steps of:
    depositing the third doped polysilicon layer on the entire surface of the oxidization layer;
    using CMP to planarize the third doped polysilicon layer; and
    dry etching to recess the third doped polysilicon layer until exposing the first ion-diffusion region.

10. A method of forming a deep trench DRAM cell, comprising steps of:
    providing a semiconductor substrate with a first conductive type with a collar oxide plate and a plurality of deep trenches passing through the collar oxide plate and the substrate to a predetermined depth;

forming a deep trench capacitor in each deep trench, wherein the deep trench capacitor has an ion diffusion region with a second conductive type in the substrate surrounding the deep trench, a dielectric layer on the sidewall and bottom of the deep trench, and a first doped polysilicon layer with the second conductive type filling the deep trench;

forming a silicon layer on the planarized surface of the collar oxide plate and the first doped polysilicon layer;

forming a first ion-diffusion layer with the second conductive type on the top of the silicon layer;

removing the ion-diffusion layer and the silicon layer on the collar oxide plate to form a plurality of pillars;

forming an oxide layer on the entire surface of the substrate;

forming a second ion-diffusion layer with the first conductive type on the sidewall of the silicon layer;

forming a third ion-diffusion layer with the second conductive type at the bottom of the silicon layer;

forming a nitride liner on the entire surface of the substrate;

forming a second doped polysilicon layer with the second conductive type on the nitride liner, wherein the top of the second doped polysilicon layer reaches the top of the third ion diffusion region;

oxidizing the second doped polysilicon layer to form an oxidation layer; and removing the exposed region of the nitride liner;

forming a third doped polysilicon layer with the second conductive type on the oxidization layer and surrounding each of the pillars.

11. The method according to claim 10, wherein the first doped polysilicon layer surrounded by the collar oxide plate serves as a connection between the deep trench capacitor and the third ion-diffusion region.

12. The method according to claim 10, wherein the silicon layer is formed by silicon-on-insulator (SOI) technology.

13. The method according to claim 12, wherein the method of using silicon-on-insulator (SOI) technology to form the silicon layer comprises steps of:

providing a silicon wafer;

using an oxygen treatment to form a silicon oxide layer on the silicon wafer;

using hydrogen ion implantation to form a predetermined cutting line between an ion-implanted region and a non-implanted region in the silicon wafer;

using wafer-bonding technology to reverse and bond the silicon wafer to the silicon substrate;

cleaving off the non-implanted region on the backside of the silicon wafer; and using CMP to planarize the ion-implanted region, thereby the remaining part of the ion-implanted region formed on the semiconductor substrate serves as the silicon layer.

14. The method according to claim 13, wherein the step of cleaving off the non-implanted region uses annealing at a temperature less than 600° C.

15. The method according to claim 13, wherein before the step of using CMP, the ion-implanted region is annealed at 1100° C.

16. The method according to claim 10, wherein the second ion-diffusion region is formed by angled implantation.

17. The method according to claim 10, wherein the third ion-diffusion region is formed by annealing treatment.

18. The method according to claim 10, wherein the method of forming the second doped polysilicon layer comprises steps of:

depositing the second doped polysilicon layer on the entire surface of the nitride liner;

using CMP to planarize the second doped polysilicon layer; and dry etching to recess the second doped polysilicon layer to reach the top of the third ion-diffusion region.

19. The method according to claim 10, wherein the method of forming the third doped polysilicon layer comprises steps of:

depositing the third doped polysilicon layer on the entire surface of the oxidization layer;

using CMP to planarize the third doped polysilicon layer; and dry etching to recess the third doped polysilicon layer until exposing the first ion-diffusion region.

20. A method of forming a deep trench DRAM cell on a semiconductor substrate with a first conductive type, comprising steps of:

forming a deep trench capacitor in the semiconductor substrate;

using silicon-on-insulator (SOI) technology to form a silicon layer on the deep trench capacitor providing a silicon wafer;

forming a first ion-diffusion layer with the second conductive type on the top of the silicon layer;

patterning the first ion-diffusion layer and the silicon layer to form a pillar over the deep trench capacitor;

forming an oxide layer on the entire surface of the semiconductor substrate;

forming a second ion-diffusion layer with the first conductive type on the sidewall of the silicon layer;

forming a third ion-diffusion layer with the second conductive type at the bottom of the silicon layer;

forming a nitride liner on the entire surface of the semiconductor substrate;

forming a second doped polysilicon layer with the second conductive type on the nitride liner, wherein the top of the second doped polysilicon layer reaches the top of the third ion diffusion region;

oxidizing the second doped polysilicon layer to form an oxidation layer; and removing the exposed region of the nitride liner; and forming a third doped polysilicon layer with the second conductive type on the oxidization layer and surrounding the pillar.

21. The method according to claim 20, wherein the method of forming the deep trench capacitor comprises steps of:

forming a deep trench in the semiconductor substrate;

forming an ion diffusion region with a second conductive type in the semiconductor substrate surrounding the deep trench;

forming a dielectric layer on the sidewall and bottom of the deep trench; and forming a first doped polysilicon layer with the second conductive type to fill the deep trench.

22. The method according to claim 20, wherein the method of using silicon-on-insulator (SOI) technology to form the silicon layer comprises steps of:

providing a silicon wafer;

using an oxygen treatment to form a silicon oxide layer on the silicon wafer;

using hydrogen ion implantation to form a predetermined cutting line between an ion-implanted region and a non-implanted region in the silicon wafer;

using wafer-bonding technology to reverse and bond the silicon wafer to the silicon substrate;

cleaving off the non-implanted region on the backside of the silicon wafer; and using CMP to planarize the ion-implanted region, thereby the remaining part of the ion-implanted region formed on the semiconductor substrate serves as the silicon layer.

23. The method according to claim 22, wherein the step of cleaving off the non-implanted region uses annealing at a temperature less than 600° C.

24. The method according to claim 22, wherein before the step of using CMP, the ion-implanted region is annealed at 1100° C.

25. The method according to claim 20, wherein the second ion-diffusion region is formed by angled implantation.

26. The method according to claim 20, wherein the third ion-diffusion region is formed by annealing treatment.

27. The method according to claim 20, wherein the method of forming the second doped polysilicon layer comprises steps of depositing the second doped polysilicon layer on the entire surface of the nitride liner;

using CMP to planarize the second doped polysilicon layer; and dry etching to recess the second doped polysilicon layer to reach the top of the third ion-diffusion region.

28. The method according to claim 20, wherein the method of forming the third doped polysilicon layer comprises steps of depositing the third doped polysilicon layer on the entire surface of the oxidization layer;

using CMP to planarize the third doped polysilicon layer; and dry etching to recess the third doped polysilicon layer until exposing the first ion-diffusion region.

* * * * *